United States Patent
Klenkler et al.

(10) Patent No.: US 8,962,994 B2
(45) Date of Patent: Feb. 24, 2015

(54) PHOTOVOLTAIC DEVICE

(75) Inventors: Richard A. Klenkler, Oakville (CA);
Avery P. Yuen, Mississauga (CA);
Nathan M. Bamsey, Burlington (CA)

(73) Assignee: Xerox Corporation, Norwalk, CT (US)

( * ) Notice: Subject to any disclaimer, the term of this patent is extended or adjusted under 35 U.S.C. 154(b) by 819 days.

(21) Appl. No.: 12/910,056

(22) Filed: Oct. 22, 2010

(65) Prior Publication Data

US 2012/0097233 A1  Apr. 26, 2012

(51) Int. Cl.
| H01L 31/00 | (2006.01) |
| H01L 51/42 | (2006.01) |
| H01L 51/00 | (2006.01) |
| B82Y 10/00 | (2011.01) |

(52) U.S. Cl.
CPC .......... *H01L 51/424* (2013.01); *H01L 51/0078* (2013.01); *H01L 51/4246* (2013.01); *B82Y 10/00* (2013.01); *H01L 51/0046* (2013.01); *H01L 2251/308* (2013.01); *Y02E 10/549* (2013.01)
USPC ...................................................... 136/263

(58) Field of Classification Search
CPC ............ H01L 51/0078; H01L 51/0046; H01L 51/424
USPC ........................................................ 136/263
See application file for complete search history.

(56) References Cited

U.S. PATENT DOCUMENTS

| 3,293,075 A | 12/1966 | Wildi |
| 4,175,981 A | 11/1979 | Loutfy et al. |
| 4,175,982 A | 11/1979 | Loutfy et al. |
| 4,471,039 A | 9/1984 | Borsenberger et al. |
| 7,772,487 B1 | 8/2010 | Robinson |
| 2002/0189666 A1* | 12/2002 | Forrest et al. ................. 136/263 |
| 2005/0098726 A1* | 5/2005 | Peumans et al. ........... 250/338.1 |
| 2009/0165857 A1 | 7/2009 | Naito et al. |
| 2009/0229670 A1 | 9/2009 | Kitamura et al. |
| 2010/0207114 A1* | 8/2010 | Koenemann et al. ........... 257/40 |

FOREIGN PATENT DOCUMENTS

WO  2009/056626 A1  5/2009

OTHER PUBLICATIONS

Hor et al., "Photovoltaic properties of cadmium sulfide/trivalent-metal phthalocyanine heterojunction devices," Appl. Phys. Lett. 42(2). Jan. 15, 1983, p. 165-167.

Hor et al., "Solvent-Induced Dimorphic Transformation in Magnesium Phthalocyanine and Its Effect on the Photoactivity," Electronics and Optics, Thin Solid Films, 106(1983) p. 291-301.

(Continued)

*Primary Examiner* — Allison Bourke

(74) *Attorney, Agent, or Firm* — Fay Sharpe LLP

(57) ABSTRACT

A photovoltaic device is disclosed. The photovoltaic device includes a substrate, an anode, a cathode, two semiconducting layers, and an electron transporting layer. The first semiconducting layer comprises a first metallophthalocyanine. The second semiconducting layer includes a blend of a second metallophthalocyanine with an electron acceptor. The second semiconducting layer is located between the first semiconducting layer and the electron transporting layer. The first and second metallophthalocyanines have different valences. The complementary absorption profiles of these layers result in a device having greater absorption and efficiency than expected, without the need for a recombination layer or the need to match current between layers.

15 Claims, 5 Drawing Sheets

(56) References Cited

OTHER PUBLICATIONS

Loutfy et al., "Electrophotographic Photoreceptors Incorporating Aggregated Phthalocyanines," Journal of Imaging Science 29: (116-121) (1985).

Loutfy et al., "Near-Infrared Photoreceptor Devices Incorporating Evaporated Chloroindium Phthalocyanine," Journal of Imaging Science 31: 31-37 (1987).

Yang et al., "Simultaneous heterojunction organic solar cells with broad spectral sensitivity," Appl. Phys. Letter 92. 053310 (2008) (3pp).

Rand et al., "Organic solar cells with sensitivity extending into the near infrared," Appl. Phys Letter 87, 233508 (2005) (3pp).

Kumar et al., "Broad spectral sensitivity and improved efficiency in CuPc/Sub-Pc organic photovoltaic devices," J. Phys. D: Appl. Phys. 42 (2009) 015103 (6pp).

Placencia et al., "Organic Photovoltaic Cells Based on Solvent-Annealed, Textured Titanyl Phthalocyanine/C60 Heterojunctions," Adv. Funct. Mater. 2009, 19, 1913-1921.

Zhang et al., "Simple tandem organic photovoltaic cells for improved energy conversion efficiency," Appl. Phys. Letter 92, 083310 (2008) (3pp).

Yuen et al., "Blend composition study of poly(3,3'-didodecylquaterthiophene)/[6,6]-phenyl C61 butyric acid methylester solution processed organic solar cells," Journal of Applied Physics 105, 016105 (2009) (3pp).

Koeppe et al., "Complexation of pyrrolldinofullerenes and zinc-phthalocyanine in a bilayer organic cell structure," Appl. Phys. Letter 87, 244102 (2005) (3pp).

Tackley et al., "Phthalocyanines: structure and vibrations," Phys. Chem. Chem. Phys., 2001, 3, (1419-1426).

Xue et al., "Asymmetric tandem organic photovoltaic cells with hybrid planar-mixed molecular heterojunctions," Appl. Phys. Letter, vol. 85, No. 23. Dec. 6, 2004 (5757-5759).

Tang, "Two-layer organic photovoltaic cell," Appl. Phys. Letter 48(2). Jan. 13, 1986 (183-185).

Brabec et al., "Origin of the Open Circuit Voltage of Plastic Solar Cells," Adv. Funct. Matter. 2001,11,No. 5, Oct. (374-380).

Terao, "Correlation of hole mobility, exciton diffusion length, and solar cell characteristics in phthalocyanine/fullerene organic solar cells," Appl. Phys. Letter 90, 103515 (2007) (3pp).

Winder et al., "Low bandgap polymers for photon harvesting in bulk heterojuction solar cells," J. Mater. Chem., 2004, 14, 1077-1086.

Dennler et al., "Flexible Conjugated Polymer-Based Plastic Solar Cells: From Basics to Applications," Proceedings of the IEEE, vol. 93, No. 8, Aug. 2005 (1429-1439).

Shen et al., "Performance Improvement of TiO2/P3HT solar cells using CuPc as a sensitizer," Appl. Phys. Letter 92, 073307 (2008) (3pp).

Peumans et al., "Small molecular weight organic thin-film photodetectors and solar cells," Appl. Phys. vol. 93, No. 7, Apr. 1, 2003 (3693-3723).

Kazmerski, "Solar photovoltaics R&D at the tipping point: A 2005 technology overview," Journal of Electron Spectroscopy and Related Phenomena 150 (2006) (105-135).

Brabec et al, "Plastic Solar Cells" Adv. Funct. Mater. 2001, 11, No. 1, Feb. (15-26).

Tian et al., "Electrical transport properties of $(Co_xAl_{1-x})_2O_{3-v}$ oxide magnetic semiconductor and corresponding $Co-Al_2O_3$ granular films," Appl. Phys. Letter 91, 013509 (2007) (3pp).

Hagglund et al., "Electromagnetic coupling of light into a silion solar cell by nanodisk plasmons," Appl. Phys. Letter 92, 053110 (2008) (3pp).

Janssen et al., "Highly efficient organic tandem solar cells using an improved connecting architecture," Appl. Phys. Letters 91, 073519 (2007) (3pp).

Chan et al., "Doping-induced efficiency enhancement in organic photovoltaic devices," Appl. Phys. Letters 90, 023504 (2007) (3pp).

\* cited by examiner

PHOTOVOLTAIC DEVICE

BACKGROUND

The present disclosure relates to a photovoltaic device useful for generating an electrical current upon exposure to wide spectrum light, such as sunlight. The materials described herein can be used in organic solar cells.

A photovoltaic device typically contains a layer of a photoactive material sandwiched between two electrodes (i.e. an anode and a cathode). The photoactive layer can absorb the energy in a photon emitted by radiation, such as sunlight. This photon energy creates an exciton, or bound electron-hole pair. Depending on the material, the electron and hole can travel a short distance (on the order of several nanometers) before spontaneous recombination occurs. The exciton can move to a junction where they can be separated, so that electrons are collected at one electrode and holes are collected at the other electrode. This allows current to flow through an external circuit.

Such light absorption and charge generation is limited in organic photovoltaic devices. Organic semiconducting materials arouse interest due to their low-cost potential, light weight, and ease of processing. However, the materials typically used in organic solar cells do not optimally match the solar spectrum, resulting in a large fraction of the light energy passing through the device being lost (i.e. not converted into electrical current) and low power conversion efficiency. With over half of the total solar irradiance residing in wavelengths above 650 nm, capturing longer wavelengths in this near infrared (NIR) range of from about 650 nm to about 1000 nm is desirable.

One highly studied group of materials is that of metallophthalocyanines, which are a small molecule containing a metal atom at the center of a cyclic molecule. Metallophthalocyanines generally have a high absorption coefficient ($\alpha > 10^5$ cm$^{-1}$) and hole mobilities of around $10^{-3}$ cm$^2$/V·sec. They typically have a Q-band peak in the red to near-infrared wavelengths. However, they also have a relatively narrow absorption profile.

It would be desirable to provide a photovoltaic device that can capture more of the light energy present in sunlight and generate greater amounts of electricity, increasing the power conversion efficiency of the device.

BRIEF DESCRIPTION

Disclosed in various embodiments herein are photovoltaic devices that have an improved overall power conversion efficiency (PCE). Generally speaking, the photovoltaic devices include two semiconducting layers. The first layer contains a first metallophthalocyanine. The second layer contains a blend of a second metallophthalocyanine and an electron acceptor. The first and second metallophthalocyanines are different from each other, and have complementary absorption profiles. The first layer is proximal to the anode, and the second layer is proximal to the cathode.

Disclosed in embodiments is a photovoltaic device comprising: a substrate; a first electrode upon the substrate; a first semiconducting layer comprising a first metallophthalocyanine; a second semiconducting layer comprising a second metallophthalocyanine and an electron acceptor, the first and second metallophthalocyanines having different valences; an electron transporting layer; and a second electrode. The second semiconducting layer is located between the first semiconducting layer and the electron transporting layer. The first semiconducting layer is located closer in distance to the first electrode than the second semiconducting layer. The electron transporting layer is located between the second semiconducting layer and the second electrode.

The first and second metallophthalocyanines may be independently structures of Formula (I):

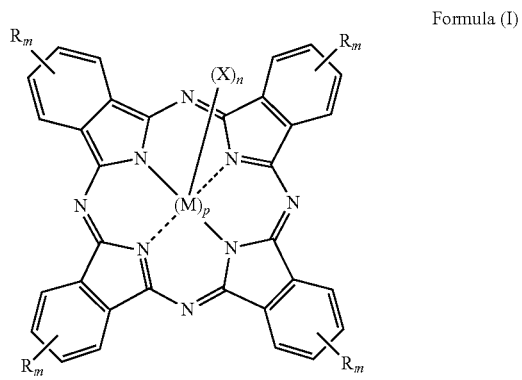

Formula (I)

wherein M is a divalent, trivalent or tetravalent metal atom; X is hydroxyl or halogen, and n is an integer from 0 to 2, or $(X)_n$ is =O; each m represents the number of R substituents on the phenyl ring, and is independently an integer from 0 to 6; each R is independently selected from the group consisting of halogen, alkyl, substituted alkyl, alkoxy, substituted alkoxy, phenoxy, phenylthio, aryl, substituted aryl, heteroaryl, —CN, and —NO$_2$; and p is 0 or 1.

In embodiments, the first metallophthalocyanine is a divalent metallophthalocyanine and the second metallophthalocyanine is a trivalent metallophthalocyanine. In specific embodiments, the first metallophthalocyanine is zinc phthalocyanine and the second metallophthalocyanine is indium chloride phthalocyanine.

The weight ratio of the second metallophthalocyanine to the electron acceptor in the second semiconducting layer may be from 1:99 to 99:1.

The electron acceptor may be C$_{60}$ fullerene, [6,6]-phenyl-C$_{61}$-butyric acid methyl ester (PCBM), C$_{70}$ fullerene, [6,6]-phenyl-C$_{71}$-butyric acid methyl ester, or a fullerene derivative. In particular embodiments, the electron transporting layer comprises the electron acceptor. Put another way, the electron transporting layer is composed of the same material as is used for the electron acceptor in the second semiconducting layer.

The anode may comprise indium tin oxide, fluorine tin oxide, doped zinc oxide, poly(3,4-ethylenedioxythiophene):poly(styrene sulfonic acid) (PEDOT:PSS), carbon nanotube, or graphene.

The cathode may comprise aluminum, silver, calcium, magnesium or alloys thereof.

The photovoltaic device may additionally comprise a hole blocking layer located between the electron transporting layer and the cathode. The hole blocking layer may comprise bathocuproine, lithium fluoride, or bathophenanthroline.

The photovoltaic device may further comprise an electron blocking layer between the anode and the first semiconducting layer. The electron blocking layer may comprise poly(3,4-ethylenedioxythiophene):poly(styrene sulfonic acid) (PEDOT:PSS), MoO$_3$, or V$_2$O$_5$.

Also disclosed in embodiments is a photovoltaic device, comprising in sequence: a substrate; an anode upon the substrate; an electron blocking layer; a first semiconducting layer comprising a first metallophthalocyanine; a second semiconducting layer comprising a second metallophthalocyanine and an electron acceptor, the first and second metallophthalocyanines being different from each other; an electron transporting layer; and a cathode upon the electron transporting layer.

Also disclosed in specific embodiments is a photovoltaic device, comprising in sequence: an optically transparent substrate; an indium tin oxide electrode upon the substrate; a first semiconducting layer comprising zinc metallophthalocyanine; a second semiconducting layer comprising a blend of indium chloride metallophthalocyanine and $C_{60}$ fullerene; an electron transporting layer comprising $C_{60}$ fullerene; a hole blocking layer comprising bathocuproine; and an aluminium electrode deposited on the hole blocking layer.

These and other non-limiting aspects of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
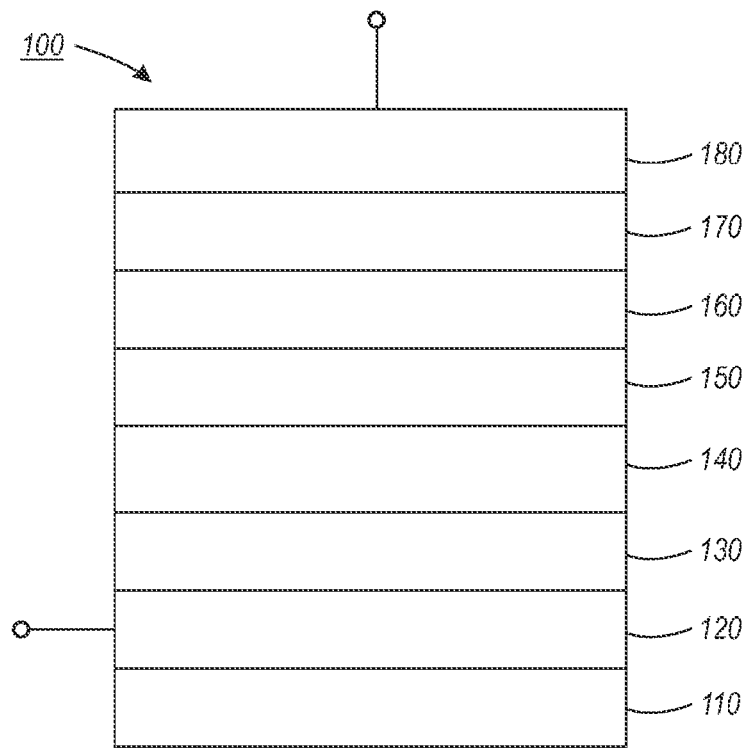
FIG. 1 is a cross-sectional view of a first exemplary photovoltaic device of the present disclosure.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

The term "comprising" is used herein as requiring the presence of the named component and allowing the presence of other components. The term "comprising" should be construed to include the term "consisting of", which allows the presence of only the named component, along with any impurities that might result from the manufacture of the named component.

The term "upon" as used herein should be construed as describing the location of a first component relative to the second component. The term should not be construed as requiring that the first component directly contact the second component, although this direct contact is covered by the use of the term.

The present disclosure relates to a photovoltaic device containing two semiconducting layers. The first semiconducting layer comprises a first metallophthalocyanine. The second semiconducting layer comprises a second metallophthalocyanine and an electron acceptor. The first and second metallophthalocyanines are different from each other. They are generally selected to have complementary absorption profiles.

FIG. 1 is a side cross-sectional view of an exemplary photovoltaic device 100. A substrate 110 is provided. A first electrode, such as anode 120, is located upon the substrate 110. A first semiconducting layer 140 is then located upon the anode 120. A second semiconducting layer 150 contacts the first semiconducting layer 140. The first semiconducting layer 140 is located closer in distance to the anode 120 than the second semiconducting layer 150. An optional electron blocking layer 130 may be located between the anode 120 and the first semiconducting layer 140, if desired. An electron transporting layer 160 contacts the second semiconducting layer 150. An optional hole blocking layer 170 is located on the electron transporting layer 160. Finally, a second electrode, such as cathode 180, is placed upon the substrate 110 and on the hole blocking layer 170. The second semiconducting layer 150 is closer to the cathode 180 than the first semiconducting layer 140. It should also be noted that the anode 120 is closer to the substrate 110 than the cathode 180.

Figure 2:
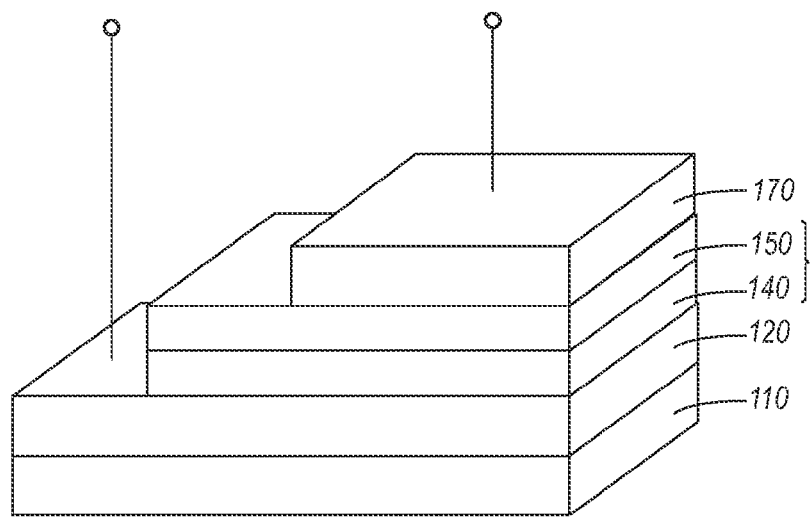
FIG. 2 is a cross-sectional view of a second exemplary photovoltaic device of the present disclosure.

As illustrated in FIG. 2, only the substrate 110, anode 120, first semiconducting layer 140, second semiconducting layer 150, electron transporting layer 160, and cathode 180 are required to produce a functioning photovoltaic device. However, the additional layers are also helpful in obtaining a highly efficient photovoltaic device. When described in other terms, the first semiconducting layer 140 and the second semiconducting layer 150 are located between the anode 120 and the cathode 180. Also, the electron transporting layer 160 is located between the second semiconducting layer 150 and the cathode 180. The hole blocking layer 170 is located between the second semiconducting layer 150 and the cathode 180 as well. When both an electron transporting layer and hole blocking layer are present, the hole blocking layer 170 is located between the electron transporting layer 160 and the cathode 180.

The first semiconducting layer 140 contains a first metallophthalocyanine. The second semiconducting layer 150 contains a second metallophthalocyanine which has a different valence compared to the first metallophthalocyanine. Metallophthalocyanines are hole transport molecules, completely conjugated, and have exceptional stability and color fastness. Their structure allows bonded species to protrude from the plane, modifying the packing and crystal structure. They generally have high absorption coefficients ($\alpha > 10^5$ cm$^{-1}$) at peak absorbance. They also have strong photoelectrical properties in the NIR range, making them useful in a photovoltaic device. These metallophthalocyanines can be considered as photon absorbers and electron donors. It should be noted that metallophthalocyanines do not include subphthalocyanines, which have only three benzene rings, whereas metallophthalocyanines have four benzene rings in their structure.

In embodiments, the first and second metallophthalocyanines are independently of Formula (I):

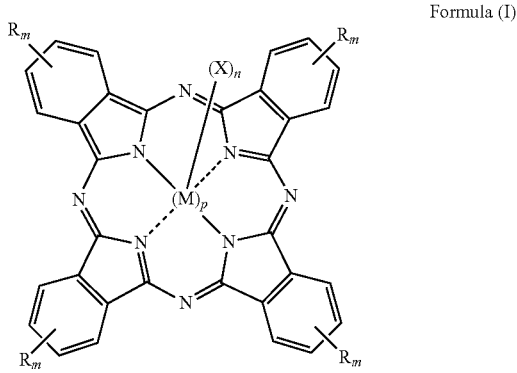

Formula (I)

wherein M is a divalent, trivalent, or tetravalent metal atom; X is hydroxyl or halogen, and n is an integer from 0 to 2, or $(X)_n$ is =O (i.e. a double-bonded oxygen atom, also referred to as "oxo"); each m represents the number of R substituents on the phenyl ring, and is independently an integer from 0 to 6; each R is independently selected from the group consisting of halogen, alkyl, substituted alkyl, alkoxy, substituted alkoxy, phenoxy, phenylthio, aryl, substituted aryl, heteroaryl, —CN, and —NO$_2$; and p is 0 or 1.

The term "alkyl" refers to a radical composed entirely of carbon atoms and hydrogen atoms which is fully saturated and of the formula $C_nH_{2n+1}$. The alkyl radical may be linear, branched, or cyclic.

The term "alkoxy" refers to an alkyl radical which is attached to an oxygen atom, i.e. —O—$C_nH_{2n+1}$.

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms).

The term "heteroaryl" refers to an aromatic radical containing at least one heteroatom replacing a carbon atom in the radical. The heteroatom is generally nitrogen, oxygen, or sulfur.

The term "substituted" refers to at least one hydrogen atom on the named radical being substituted with another functional group, such as halogen, —CN, —NO$_2$, —COOH, and —SO$_3$H. An exemplary substituted alkyl group is a perhaloalkyl group, wherein one or more hydrogen atoms in an alkyl group are replaced with halogen atoms, such as fluorine, chlorine, iodine, and bromine.

Generally, the alkyl and alkoxy groups each independently contain from 1 to 30 carbon atoms. Similarly, the aryl groups independently contain from 6 to 30 carbon atoms.

In certain embodiments, the divalent metal atom M may be copper, zinc, magnesium, tin, lead, nickel, cobalt, antimony, iron, or manganese. The trivalent metal atom M may be selected from the group consisting of indium(III), gallium(III), and aluminum(III) or tin(III). The tetravalent metal atom M may be selected from the group consisting of vanadium(IV) and titanium(IV).

Exemplary phthalocyanines include indium chloride phthalocyanine (ClInPc), aluminum chloride phthalocyanine (ClAlPc), gallium chloride phthalocyanine (ClGaPc), vanadium oxide phthalocyanine (VOPc), titanium oxide phthalocyanine (TiOPc), and copper phthalocyanine (CuPc). When p is 0, the compound is dihydrogen phthalocyanine (H$_2$Pc). These phthalocyanines are illustrated here as Formulas (1)-(7).

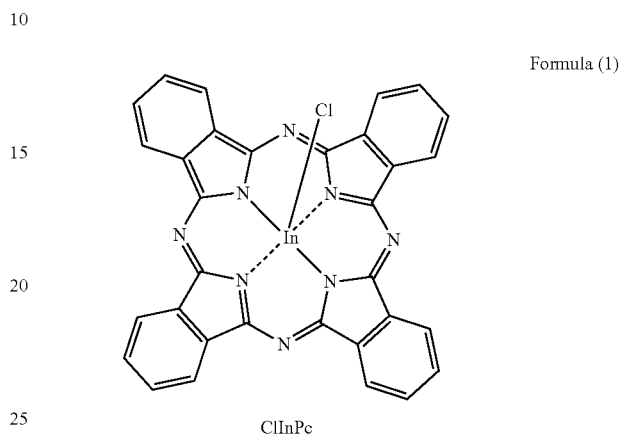

Formula (1)

ClInPc

Formula (2)

ClAlPc

Formula (3)

ClGaPc

Formula (4)

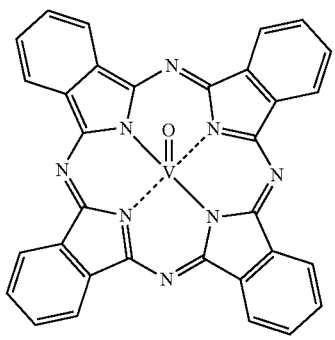

VOPc

Formula (5)

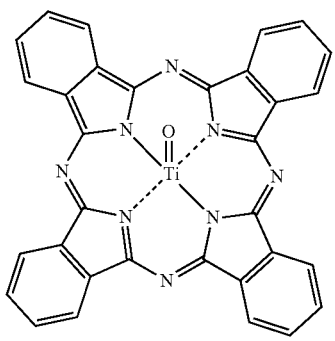

TiOPc

Formula (6)

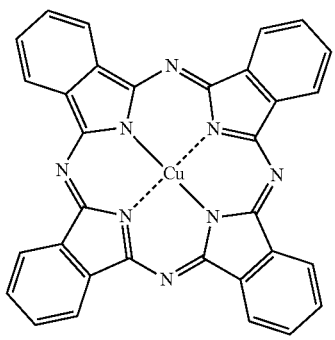

CuPc

Formula (7)

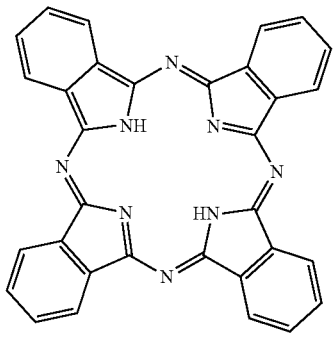

H₂Pc

In particular embodiments, the first metallophthalocyanine is a divalent metallophthalocyanine (i.e. contains a divalent metal atom) and the second metallophthalocyanine is a trivalent metallophthalocyanine (i.e. contains a trivalent metal atom). In specific embodiments, the first metallophthalocyanine is zinc metallophthalocyanine and the second metallophthalocyanine is indium chloride phthalocyanine.

The second semiconducting layer also comprises an electron acceptor. An electron acceptor is a material or compound that accepts electrons transferred to it by another compound. Generally speaking, the electron acceptor moves electrons more efficiently than the second metallophthalocyanine. Exemplary materials that can be used as the electron acceptor include $C_{60}$ fullerene, [6,6]-phenyl-$C_{61}$-butyric acid methyl ester (PCBM), $C_{70}$ fullerene, [6,6]-phenyl-$C_{71}$-butyric acid methyl ester (PC[70]BM), or any fullerene derivative. In particular embodiments, the electron acceptor is $C_{60}$ fullerene. The first semiconducting layer does not include an electron acceptor.

In the second semiconducting layer, the weight ratio of the second metallophthalocyanine to the electron acceptor is from 1:99 to 99:1, based on the weight of the second metallophthalocyanine and the electron acceptor. In some embodiments, the weight ratio is from 30:70 to 70:30. Desirably, the second semiconducting layer is a homogeneous blend of the second metallophthalocyanine and the electron acceptor, although some separation of the two components may occur in isolated portions of the second layer.

The absorption profiles of the first and second metallophthalocyanines in the two semiconducting layers should be selected to complement each other, resulting in improved current generation. Put another way, the first and second metallophthalocyanines are different from each other, i.e. contain different metal atoms and are not simply polymorphs of the same metallophthalocyanine. For example, ZnPc absorbs photons in the 600-700 nm region. ClInPc has a measured peak absorption extending from 600-800 nm. By combining these two metallophthalocyanines in the same photovoltaic device, a significant broadening of the absorption profile can be obtained. This leads to an increase in the short circuit current ($I_{SC}$) due to an improved overlap with the solar spectrum. Another advantage of using two metallophthalocyanines is that they have similar hole mobilities, which helps alleviate carrier mobility balance concerns.

The first semiconducting layer (containing the first metallophthalocyanine) has a thickness of at least 3 nanometers. In the case of a thin film (approximately 2 nm or less), the film may aggregate into isolated crystallites, leaving holes in the film. This is undesirable. It is contemplated that the first semiconducting layer is a continuous film. Put another way, the second semiconducting layer does not contact the component of the device that is on the other side of the first semiconducting layer. The second semiconducting layer (containing the blend of the second metallophthalocyanine and the electron acceptor) has a thickness of 3 nanometers to 60 nanometers.

The first and second semiconducting layers are typically deposited using vacuum physical vapor deposition, which is a common industrial thin-film fabrication technique. Other deposition techniques can include liquid deposition, such as spin coating, dip coating, blade coating, rod coating, screen printing, stamping, and ink jet printing, as well as other conventional processes known in the art.

If desired, a chemical treatment can be applied to the first semiconducting layer to change the polymorph of the originally-deposited metallophthalocyanine. A polymorph is a specific crystalline structure of the phthalocyanine, and phthalocyanines may have multiple crystal structures, or in other words more than one polymorphic form. Several different metallophthalocyanines are known to undergo polymorphic changes when chemically treated. Several different chemical treatments can be used to change the metallophthalocyanine from one polymorph to another polymorph. One method is by solvent treatment. Solvent vapor exposure, for example to vapors of tetrahydrofuran (THF), has been shown to modify the structure and properties of several moieties of metallophthalocyanines. Similarly, several metallophthalocyanines are easily converted to different polymorphs. Solvent allows swelling and relaxation of the metallophthalocyanine film, resulting in highly photosensitive and dimorphic structures. This also extends the absorption profile of some polymorphs beyond 900 nm. Another method is thermal treatment, with changes to crystal structure due to varying temperatures and annealing times. The presence of a different polymorph of the metallophthalocyanine in the first semiconducting layer can be confirmed by techniques including X-ray diffraction (XRD) and other means known in the art.

One structure of organic solar cells that has been explored to increase efficiency has been a series tandem cell, where layers having different absorption characteristics are stacked on top of each other and connected via a recombination layer. The recombination layer will absorb and reflect light, decreasing the amount of transmitted light available for absorption in one layer. In addition, the short circuit current density ($J_{SC}$) of the overall device is the lowest $J_{SC}$ of each individual absorption layer. Thus, the short circuit current density ($J_{SC}$) of each layer is usually tuned to match. Because the current is heavily dependent on the thickness and structure of these layers (much more so than the voltage), the manufacturing process for a series tandem cell is much more difficult, because small changes in thickness or structure can lead to such wide variability in device performance.

In contrast, the parallel tandem cell of the present disclosure does not require a complicated recombination layer, and does not require the $J_{SC}$ of each layer to be matched. However, the absorption profile of the parallel tandem cell captures just as wide a portion of the solar spectrum as a traditional series tandem cell.

A significant feature of the photovoltaic device is the blended second semiconducting layer being located between the first semiconducting layer and the electron transporting layer. This structure allows electrons generated in the first semiconducting layer to be transferred to the electron acceptor in the second semiconducting layer and onwards to the cathode. This results in relatively efficient current generation at the junction between the first and second semiconducting layers. Electrons generated by the second metallophthalocyanine in the second semiconducting layer can also be transferred to the electron acceptor in the second semiconducting layer and onwards to the cathode. Due to the alignment of the Highest Occupied Molecular Orbital (HOMO) levels of the first and second metallophthalocyanines, holes generated by the second metallophthalocyanine can also be transferred to the first semiconducting layer and on to the anode. Because there are efficient pathways for photogenerated holes and electrons to move to their respective electrodes, a contribution to current generation can occur from both metallophthalocyanines. In essence, the cell is able to capture and convert more light to electricity.

The substrate 110 of the photovoltaic device supports the other components of the photovoltaic device. The substrate should also be optically transparent in at least the NIR range of the spectrum, to allow light to pass through and contact the semiconducting bilayer. In embodiments, the substrate is composed of materials including, but not limited to, glass, or a plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The anode 120 and the cathode 180 are composed of an electrically conductive material. Exemplary materials suitable for the electrodes include aluminum, gold, silver, chromium, nickel, platinum, indium tin oxide (ITO), zinc oxide (ZnO), and the like. One of the electrodes, and in particular the anode, is made of an optically transparent material like ITO or ZnO. In specific embodiments, the anode is ITO and the cathode is aluminum. Typical thicknesses for the electrodes are about, for example, from about 40 nanometers to about 1 micrometer, with a more specific thickness being about 40 to about 400 nanometers.

An electron blocking layer 130 may be present between the anode 120 and the first semiconducting layer 140. This layer prevents recombination at the anode by inhibiting the movement of electrons to the anode. Exemplary materials include poly(3,4-ethylenedioxythiophene):poly(styrene sulfonic acid) (PEDOT:PSS), $MoO_3$, and $V_2O_5$. The electron blocking layer may have a thickness of from about 1 to about 100 nanometers.

An electron transporting layer 160 may be present between the second semiconducting layer 150 and the cathode 180. This layer is generally made from a material which allows electrons to move efficiently, and may also absorb some light wavelengths. Exemplary materials for the electron transporting layer include $C_{60}$ fullerene, [6,6]-phenyl-$C_{61}$-butyric acid methyl ester (PCBM), $C_{70}$ fullerene, [6,6]-phenyl-$C_{71}$-butyric acid methyl ester (PC[70]BM), or any fullerene derivative. The electron transporting layer may have a thickness of from about 1 nanometer to about 50 nanometers. In particular embodiments, the electron transporting layer comprises the electron acceptor. In other words, the material used as the electron acceptor in the second semiconducting layer is the same material used to make up the electron transporting layer.

A hole blocking layer 170 may also be located between the second semiconducting layer 150 and the cathode 180. When the electron transporting layer is present, the hole blocking layer 170 is between the electron transporting layer 160 and the cathode 180. Exemplary hole blocking materials for this layer include bathocuproine (BCP), lithium fluoride, and bathophenanthroline. The hole blocking layer may have a thickness of from about 0.1 nanometers to about 100 nanometers.

The following examples illustrate organic photovoltaic devices made according to the methods of the present disclosure. The examples are merely illustrative and are not intended to limit the present disclosure with regard to the materials, conditions, or process parameters set forth therein. All parts are percentages by weight unless otherwise indicated.

EXAMPLES

Device Fabrication Procedure

An indium tin oxide (ITO) coated aluminosilicate glass substrate (50 mm×50 mm) was provided. The ITO was present in an amount sufficient to achieve a sheet resistance of 15 Ω/sq, and acted as an anode. The substrate cleaning procedure included washing with soap solution, de-ionized water, methanol, isopropanol, and then UV-ozone exposure.

After cleaning, substrates were loaded into a multi-boat, multi-mask thermal evaporator. A cryo-pump was then used to draw a vacuum of <4×10$^{-4}$ Pa before any layer was deposited, and the pressure was monitored to ensure that it did not rise beyond $5 \times 10^{-4}$ Pa during evaporation.

Three device structures were subsequently fabricated. Quartz crystal monitors were used to control the layer thickness. All layers were deposited at a rate of approximately 0.08 nm/sec, and were sequentially layered at high vacuum. No layer was exposed to air until after the device was completed. All metallophthalocyanines and $C_{60}$ were purified by 3-zone train sublimation.

Device 1 had a first semiconducting layer of ZnPc (10 nm thickness) and a second layer of $C_{60}$ (30 nm thickness).

Device 2 had a first semiconducting layer (10 nm thickness) formed from a 1:1 (wt/wt) blend of ClInPc and $C_{60}$. A second layer of $C_{60}$ (30 nm thickness) was subsequently deposited upon the first layer.

Device 3 had a first semiconducting layer of ZnPc (10 nm thickness). A second semiconducting layer (10 nm thickness) formed from a 1:1 (wt/wt) blend of ClInPc and $C_{60}$ was subsequently deposited upon the first layer. A third layer of $C_{60}$ (30 nm thickness) was then deposited upon the second layer.

All devices were finished with a bathocuproine (BCP) hole blocking layer (5 nm thickness) and an aluminum anode (50 nm thickness). Sublimed grade BCP was purchased from Sigma-Aldrich and used without further purification.

Comparison

Completed devices were connected to external measurement circuitry using pressure contacts. The devices were illuminated through the ITO electrode with 100 mW/cm² simulated sunlight using an Oriel 96000 solar simulator with an AM1.5G spectral filter. Samples were placed inside a chamber in a flowing argon environment while tested. Input power was monitored with a Newport 818-UV/CM detector and Newport 1830-C optical power meter. A Keithley 238 source-measure unit and PC collected J-V data. The active device area was 7 mm² defined by a shadow mask.

External Quantum Efficiency (EQE) measurements were performed using a calibrated monochromator from Photon Technology International and a Keithley 6485 picoammeter, measuring short circuit current as a function of incident wavelength. This property measures a device's electrical sensitivity to light, and provides information on the current that a given device will produce when illuminated by a particular wavelength.

Figure 3:
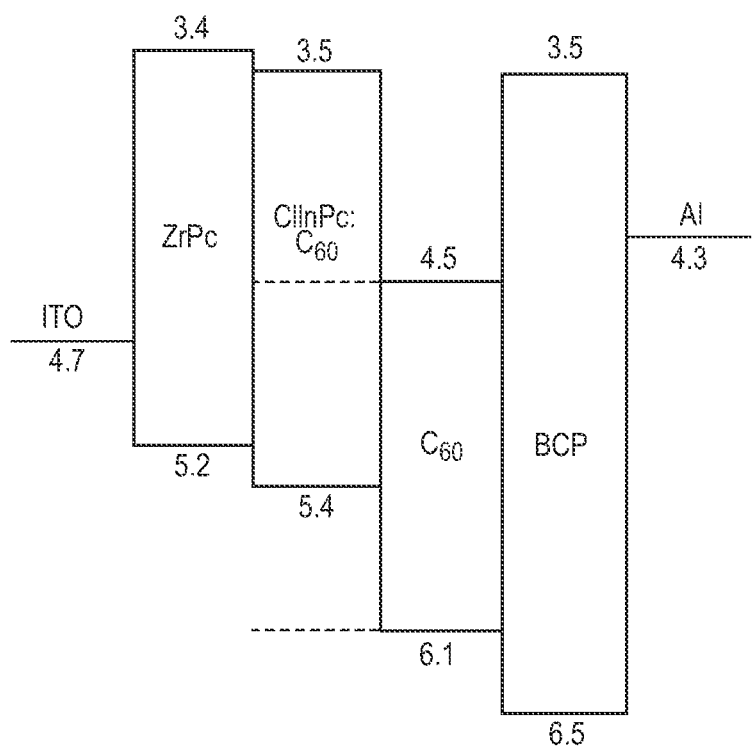
FIG. 3 is the band diagram for a simple parallel tandem photovoltaic device of the present disclosure as described in the Examples.

The band diagram for the simple parallel tandem cell (Device 3) is shown in FIG. 3. The current is produced in parallel by both semiconducting layers and therefore does not require the current matching conditions that series tandem cells require. Holes generated in the ZnPc can freely flow to the ITO electrode, and electrons generated in the ZnPc can be transferred through the $C_{60}$ network that exists in the blended layer. Similarly, holes generated in the ClInPc in the blended layer can be transferred to the ZnPc since the HOMO of ZnPc lies closer to vacuum than the HOMO of ClInPc. Electrons in the ClInPc can also be transferred to the $C_{60}$ network in the blended layer.

Figure 4:
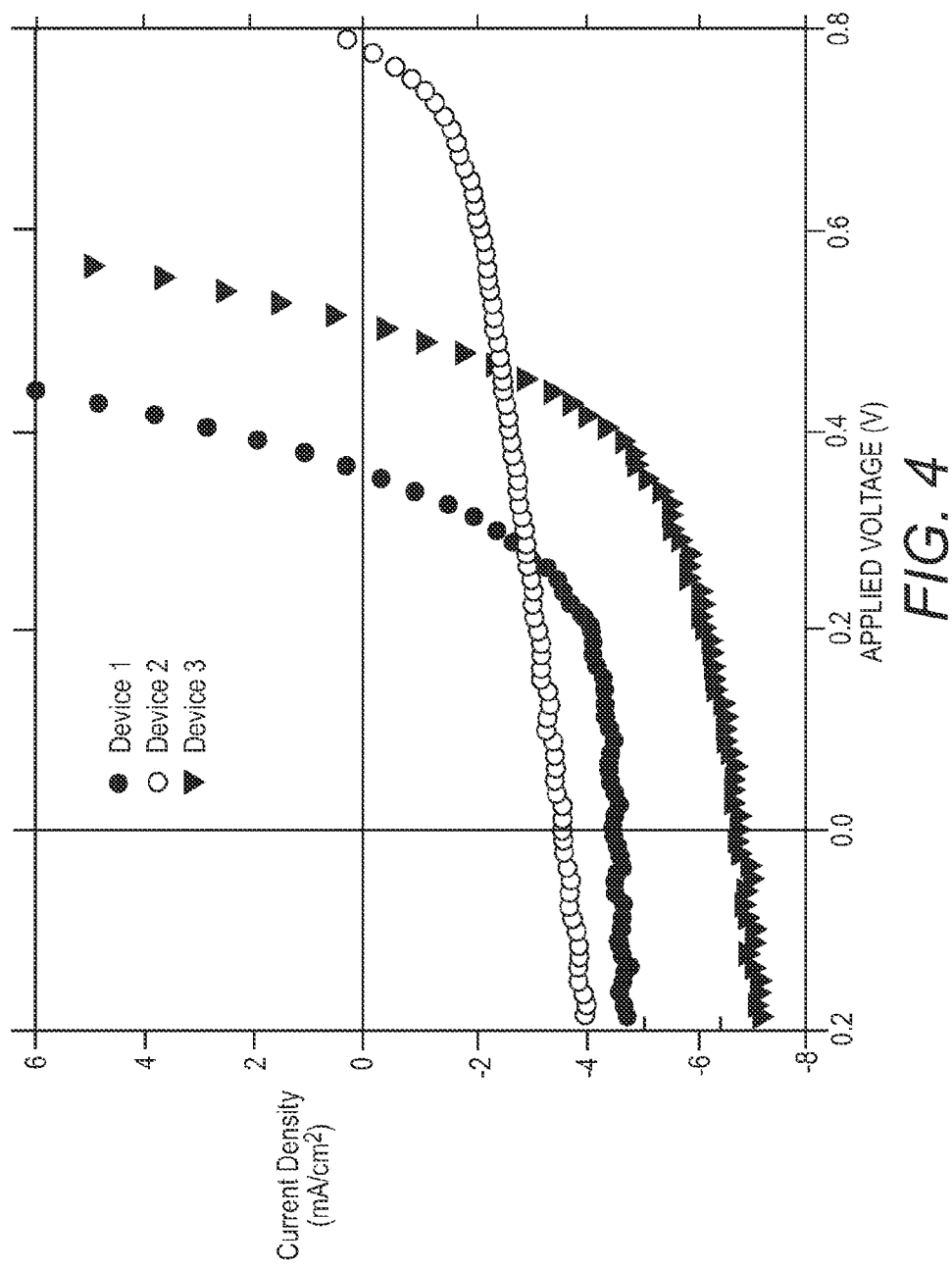
FIG. 4 is a graph showing the current density versus the applied voltage for two comparative devices and a photovoltaic device of the present disclosure.

FIG. 4 is a graph showing the current density versus the applied voltage for the three devices. Current density was calculated by dividing the current by the active area.

Comparing Device 1 to Device 2, the most prevalent difference is the open circuit voltage $V_{OC}$ (voltage on the device when the current is zero). Device 2 exhibited a very high $V_{OC}$ because it was based on a trivalent metallophthalocyanine. In comparison, Device 1 (divalent ZnPc) had a much lower $V_{OC}$. Device 1 had only a slightly higher short circuit current $J_{SC}$ (current flow when the voltage is zero) compared to Device 2. This resulted in Device 1 having a relatively low power conversion efficiency (PCE) of 0.86%. Device 2 had a PCE of 1.34%, mostly due to the much higher $V_{OC}$. The power conversion efficiency PCE is the efficiency obtained by the device at its optimal load.

Inserting the ClInPc:$C_{60}$ blended layer of Device 2 between the two layers of Device 1 resulted in Device 3. In FIG. 4, Device 3 had a significantly higher $J_{SC}$ than either Device 1 or Device 2. The $V_{OC}$ of Device 3 was between the $V_{OC}$ of Device 1 and Device 2, possibly owing to the lowering of the HOMO of ZnPc due to the presence of ClInPc. In addition, while no attempts at optimization are reported here, the current from each layer added to a sum that was close to the measured $J_{SC}$ of Device 3. In other words, Device 3 suffered from little loss in current due to recombination arising from the introduction of the additional blended layer. As a result of the favorable increase in current and the increase in voltage, with little change to the fill factor, the overall PCE of Device 3 was 1.81%, more than double the efficiency of Device 1. The PCE of Device 3 is only slightly lower than the combined PCEs of Device 1 and Device 2. This performance is similar to what could be achieved with a series tandem structure, however is a much simpler design and is not hindered by current matching considerations.

Figure 5:
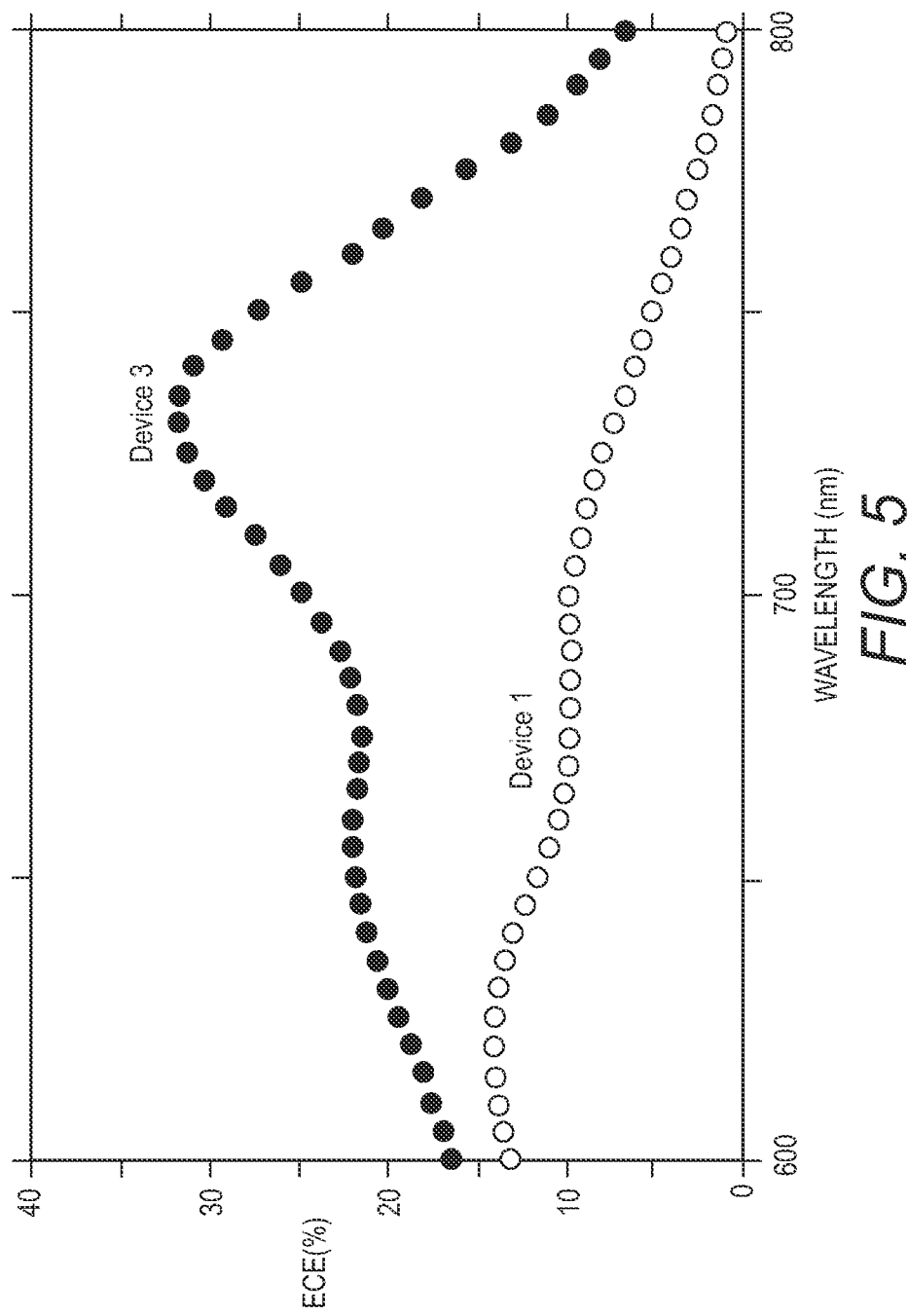
FIG. 5 is a graph showing the external quantum efficiency of a comparative device and a photovoltaic device of the present disclosure.
Figure 6:
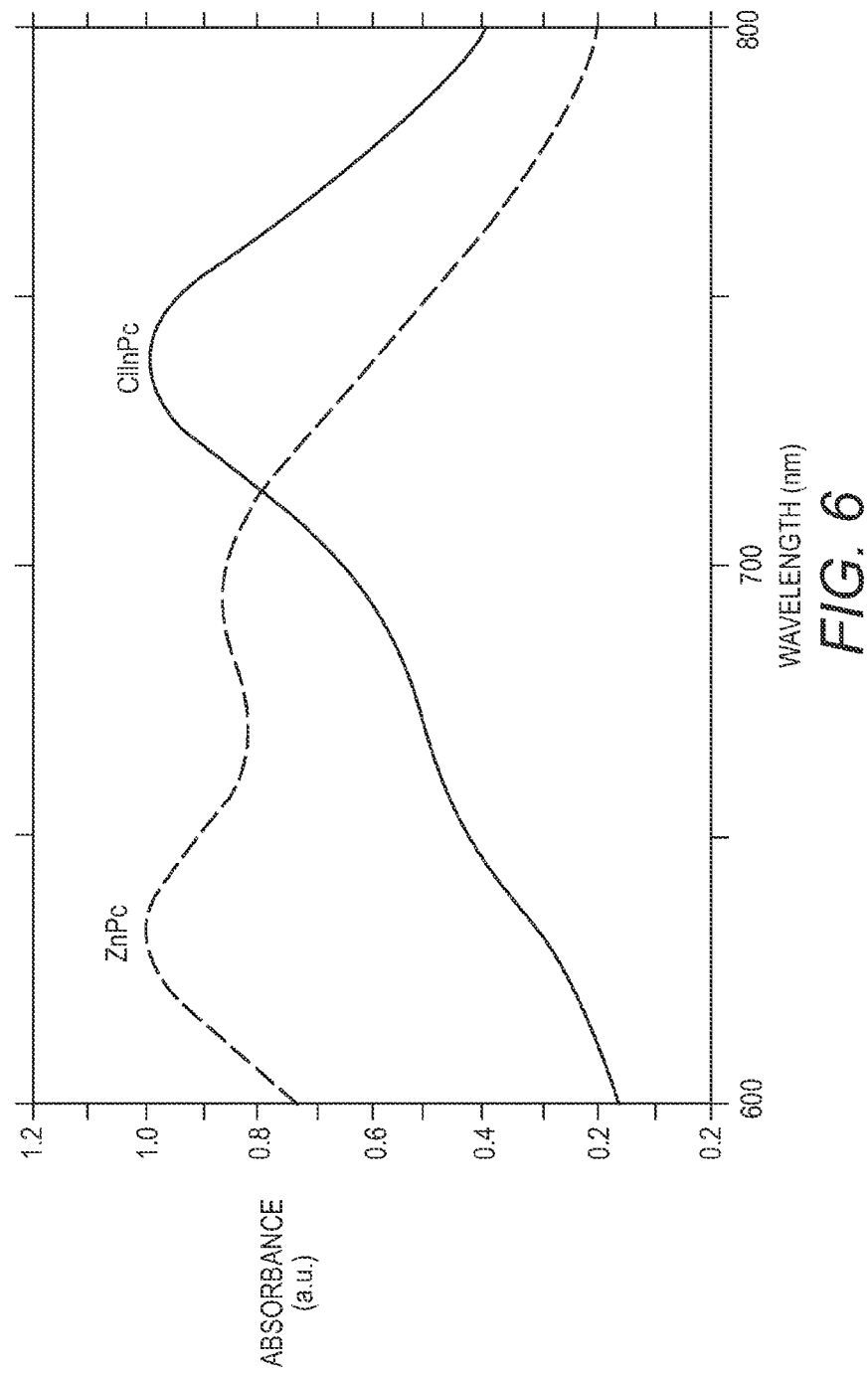
FIG. 6 is a graph showing the absorption profile for zinc phthalocyanine and indium chloride phthalocyanine.

In order to investigate the relative current contribution from each layer, the external quantum efficiency (EQE) of Devices 1 and 3 are shown in FIG. 5. The UV absorption profile for ZnPc and ClInPc are shown in FIG. 6. The EQE of Device 1 follows very closely the shape of the ZnPc absorption profile, implying that the current contribution in this area of the solar spectrum arises from exciton generation in the ZnPc layer. Consequently, Device 1 has a decreasing current contribution starting at 700 nm, which coincides with the drop in photon absorption in ZnPc. The EQE profile of Device 3 shows current contribution in the 600-700 nm region from the ZnPc layer, and also a very clear current contribution increase near 700 nm. The addition of the ClInPc:$C_{50}$ blended layer resulted in a relative five-fold increase in EQE at 740 nm. This EQE peak follows the absorption profile of ClInPc, clearly showing that exciton generation in the ClInPc:$C_{60}$ blended layer is primarily responsible for the photocurrent at wavelengths above 700 nm.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:

1. A photovoltaic device, comprising:
a substrate;
a first electrode upon the substrate;
a first semiconducting layer comprising zinc phthalocyanine;
a second semiconducting layer comprising an electron acceptor and a metallophthalocyanine consisting of indium chloride phthalocyanine;
an electron transporting layer; and
a second electrode;
wherein the second semiconducting layer is located between the first semiconducting layer and the electron transporting layer, the first semiconducting layer being located closer in distance to the first electrode than the second semiconducting layer; and wherein the electron transporting layer is located between the second semiconducting layer and the second electrode.

2. The photovoltaic device of claim 1, wherein the weight ratio of the indium chloride phthalocyanine to the electron acceptor in the second semiconducting layer is from 1:99 to 99:1.

3. The photovoltaic device of claim 1, wherein the electron acceptor is $C_{60}$ fullerene, [6,6]-phenyl-$C_{61}$-butyric acid methyl ester (PCBM), $C_{70}$ fullerene, [6,6]-phenyl-$C_{71}$-butyric acid methyl ester (PC[70]BM), or any fullerene derivative.

4. The photovoltaic device of claim 1, wherein the electron transporting layer comprises the electron acceptor.

5. The photovoltaic device of claim 1, wherein the first electrode comprises indium tin oxide, fluorine tin oxide, doped zinc oxide, poly(3,4-ethylenedioxythiophene):poly(styrene sulfonic acid) (PEDOT:PSS), carbon nanotube, or graphene.

6. The photovoltaic device of claim 1, wherein the second electrode comprises aluminum, silver, calcium, magnesium or alloys thereof.

7. The photovoltaic device of claim 1, further comprising a hole blocking layer located between the electron transporting layer and the second electrode.

8. The photovoltaic device of claim 7, wherein the hole blocking layer comprises bathocuproine, lithium fluoride, or bathophenanthroline.

9. The photovoltaic device of claim 1, further comprising an electron blocking layer between the first electrode and the first semiconducting layer.

10. The photovoltaic device of claim 9, wherein the electron blocking layer comprises poly(3,4-ethylenedioxythiophene):poly(styrene sulfonic acid) (PEDOT:PSS), $MoO_3$, or $V_2O_5$.

11. A photovoltaic device, comprising in sequence:
a substrate;
an anode upon the substrate;
a first semiconducting layer comprising zinc phthalocyanine;
a second semiconducting layer comprising an electron acceptor and a metallophthalocyanine consisting of indium chloride phthalocyanine;
an electron transporting layer; and
a cathode upon the electron transporting layer.

12. The photovoltaic device of claim 11, wherein the weight ratio of the indium chloride phthalocyanine to the electron acceptor in the second semiconducting layer is from 1:99 to 99:1.

13. The photovoltaic device of claim 11, wherein the electron acceptor is $C_{60}$, [6,6]-phenyl-$C_{61}$-butyric acid methyl ester (PCBM), $C_{70}$ fullerene, [6,6]-phenyl-$C_{71}$-butyric acid methyl ester, or a fullerene derivative.

14. A photovoltaic device, comprising in sequence:
an optically transparent substrate;
an indium tin oxide electrode upon the substrate;
a first semiconducting layer comprising zinc phthalocyanine;
a second semiconducting layer comprising a blend of $C_{60}$ fullerene and a metallophthalocyanine consisting of indium chloride phthalocyanine;
an electron transporting layer comprising $C_{60}$ fullerene;
a hole blocking layer comprising bathocuproine; and
an aluminum electrode deposited on the hole blocking layer.

15. The photovoltaic device of claim 14, wherein the weight ratio of the indium chloride phthalocyanine to the $C_{60}$ fullerene in the second semiconducting layer is from 30:70 to 70:30.

* * * * *